(12) United States Patent  
Feng et al.

(10) Patent No.: US 9,277,668 B2
(45) Date of Patent: Mar. 1, 2016

(54) INDICIA-READING MODULE WITH AN INTEGRATED FLEXIBLE CIRCUIT

(71) Applicant: Hand Held Products, Inc., Fort Mill, SC (US)

(72) Inventors: Chen Feng, Snohomish, WA (US); Tao Xian, Columbus, NJ (US); Gregory Rueblinger, Stratford, NJ (US); Michael Vincent Miraglia, Hamilton, NJ (US); Edward C. Bremer, Victor, NY (US)

(73) Assignee: Hand Held Products, Inc., Fort Mill, SC (US)

( * ) Notice: Subject to any disclaimer, the term of this patent is extended or adjusted under 35 U.S.C. 154(b) by 0 days.

(21) Appl. No.: 14/276,287

(22) Filed: May 13, 2014

(65) Prior Publication Data

US 2015/0334864 A1 Nov. 19, 2015

(51) Int. Cl.
*H05K 7/02* (2006.01)
*G06K 7/10* (2006.01)

(52) U.S. Cl.
CPC ............ *H05K 7/026* (2013.01); *G06K 7/10821* (2013.01)

(58) Field of Classification Search
CPC ......... H05K 7/026; H05K 3/36; H05K 1/148; G06K 7/10821; G06K 7/10881; G06K 7/10722; G06K 7/10792; G07F 7/0873
See application file for complete search history.

(56) References Cited

U.S. PATENT DOCUMENTS

| | | |
|---|---|---|
| 6,832,725 B2 | 12/2004 | Gardiner et al. |
| 7,128,266 B2 | 10/2006 | Zhu et al. |
| 7,159,783 B2 | 1/2007 | Walczyk et al. |
| 7,413,127 B2 | 8/2008 | Ehrhart et al. |
| 7,726,575 B2 | 6/2010 | Wang et al. |
| 8,294,969 B2 | 10/2012 | Plesko |
| 8,317,105 B2 | 11/2012 | Kotlarsky et al. |
| 8,322,622 B2 | 12/2012 | Liu |
| 8,366,005 B2 | 2/2013 | Kotlarsky et al. |
| 8,371,507 B2 | 2/2013 | Haggerty et al. |
| 8,376,233 B2 | 2/2013 | Horn et al. |
| 8,381,979 B2 | 2/2013 | Franz |
| 8,390,909 B2 | 3/2013 | Plesko |

(Continued)

FOREIGN PATENT DOCUMENTS

| | | |
|---|---|---|
| WO | 2013163789 A1 | 11/2013 |
| WO | 2013173985 A1 | 11/2013 |
| WO | 2014019130 A1 | 2/2014 |

OTHER PUBLICATIONS

U.S. Appl. No. 14/274,858 for Mobile Printer With Optional Battery Accessory, filed May 12, 2014, (Marty et al.), 26 pages.

(Continued)

*Primary Examiner* — Sonji Johnson
(74) *Attorney, Agent, or Firm* — Additon, Higgins, & Pendleton, P.A.

(57) ABSTRACT

An indicia-reading module suitable for integration within a host mobile computing device that has an integrated flexible circuit is disclosed. The indicia-reading module includes a plurality of subassemblies, each supported and electrically connected by a discrete, rigid, multilayer printed-circuit-board (PCB). A unitary flexible circuit electrically connects the subassemblies and is physically integrated between two inner layers of each subassembly's discrete, rigid, multilayer printed-circuit-board. The use of the integrated flexible circuit aids in reducing module size, signal loss, and interference with the host mobile computing device.

15 Claims, 3 Drawing Sheets

(56) References Cited

U.S. PATENT DOCUMENTS

| | | | |
|---|---|---|---|
| 8,408,464 B2 | 4/2013 | Zhu et al. | |
| 8,408,468 B2 | 4/2013 | Van Horn et al. | |
| 8,408,469 B2 | 4/2013 | Good | |
| 8,424,768 B2 | 4/2013 | Rueblinger et al. | |
| 8,448,863 B2 | 5/2013 | Xian et al. | |
| 8,457,013 B2 | 6/2013 | Essinger et al. | |
| 8,459,557 B2 | 6/2013 | Havens et al. | |
| 8,469,272 B2 | 6/2013 | Kearney | |
| 8,474,712 B2 | 7/2013 | Kearney et al. | |
| 8,479,992 B2 | 7/2013 | Kotlarsky et al. | |
| 8,490,877 B2 | 7/2013 | Kearney | |
| 8,517,271 B2 | 8/2013 | Kotlarsky et al. | |
| 8,523,076 B2 | 9/2013 | Good | |
| 8,528,818 B2 | 9/2013 | Ehrhart et al. | |
| 8,544,737 B2 | 10/2013 | Gomez et al. | |
| 8,548,420 B2 | 10/2013 | Grunow et al. | |
| 8,550,335 B2 | 10/2013 | Samek et al. | |
| 8,550,354 B2 | 10/2013 | Gannon et al. | |
| 8,550,357 B2 | 10/2013 | Kearney | |
| 8,556,174 B2 | 10/2013 | Kosecki et al. | |
| 8,556,176 B2 | 10/2013 | Van Horn et al. | |
| 8,556,177 B2 | 10/2013 | Hussey et al. | |
| 8,559,767 B2 | 10/2013 | Barber et al. | |
| 8,561,895 B2 | 10/2013 | Gomez et al. | |
| 8,561,903 B2 | 10/2013 | Sauerwein | |
| 8,561,905 B2 | 10/2013 | Edmonds et al. | |
| 8,565,107 B2 | 10/2013 | Pease et al. | |
| 8,571,307 B2 | 10/2013 | Li et al. | |
| 8,579,200 B2 | 11/2013 | Samek et al. | |
| 8,583,924 B2 | 11/2013 | Caballero et al. | |
| 8,584,945 B2 | 11/2013 | Wang et al. | |
| 8,587,595 B2 | 11/2013 | Wang | |
| 8,587,697 B2 | 11/2013 | Hussey et al. | |
| 8,588,869 B2 | 11/2013 | Sauerwein et al. | |
| 8,590,789 B2 | 11/2013 | Nahill et al. | |
| 8,596,539 B2 | 12/2013 | Havens et al. | |
| 8,596,542 B2 | 12/2013 | Havens et al. | |
| 8,596,543 B2 | 12/2013 | Havens et al. | |
| 8,599,271 B2 | 12/2013 | Havens et al. | |
| 8,599,957 B2 | 12/2013 | Peake et al. | |
| 8,600,158 B2 | 12/2013 | Li et al. | |
| 8,600,167 B2 | 12/2013 | Showering | |
| 8,602,309 B2 | 12/2013 | Longacre et al. | |
| 8,608,053 B2 | 12/2013 | Meier et al. | |
| 8,608,071 B2 | 12/2013 | Liu et al. | |
| 8,611,309 B2 | 12/2013 | Wang et al. | |
| 8,615,487 B2 | 12/2013 | Gomez et al. | |
| 8,621,123 B2 | 12/2013 | Caballero | |
| 8,622,303 B2 | 1/2014 | Meier et al. | |
| 8,628,013 B2 | 1/2014 | Ding | |
| 8,628,015 B2 | 1/2014 | Wang et al. | |
| 8,628,016 B2 | 1/2014 | Winegar | |
| 8,629,926 B2 | 1/2014 | Wang | |
| 8,630,491 B2 | 1/2014 | Longacre et al. | |
| 8,635,309 B2 | 1/2014 | Berthiaume et al. | |
| 8,636,200 B2 | 1/2014 | Kearney | |
| 8,636,212 B2 | 1/2014 | Nahill et al. | |
| 8,636,215 B2 | 1/2014 | Ding et al. | |
| 8,636,224 B2 | 1/2014 | Wang | |
| 8,638,806 B2 | 1/2014 | Wang et al. | |
| 8,640,958 B2 | 2/2014 | Lu et al. | |
| 8,640,960 B2 | 2/2014 | Wang et al. | |
| 8,643,717 B2 | 2/2014 | Li et al. | |
| 8,646,692 B2 | 2/2014 | Meier et al. | |
| 8,646,694 B2 | 2/2014 | Wang et al. | |
| 8,657,200 B2 | 2/2014 | Ren et al. | |
| 8,659,397 B2 | 2/2014 | Vargo et al. | |
| 8,668,149 B2 | 3/2014 | Good | |
| 8,678,285 B2 | 3/2014 | Kearney | |
| 8,678,286 B2 | 3/2014 | Smith et al. | |
| 8,682,077 B1 | 3/2014 | Longacre | |
| D702,237 S | 4/2014 | Oberpriller et al. | |
| 8,687,282 B2 | 4/2014 | Feng et al. | |
| 8,692,927 B2 | 4/2014 | Pease et al. | |
| 8,695,880 B2 | 4/2014 | Bremer et al. | |
| 8,698,949 B2 | 4/2014 | Grunow et al. | |
| 8,702,000 B2 | 4/2014 | Barber et al. | |
| 8,717,494 B2 | 5/2014 | Gannon | |
| 8,720,783 B2 | 5/2014 | Biss et al. | |
| 8,723,804 B2 | 5/2014 | Fletcher et al. | |
| 8,723,904 B2 | 5/2014 | Marty et al. | |
| 8,727,223 B2 | 5/2014 | Wang | |
| 2007/0063048 A1 | 3/2007 | Havens et al. | |
| 2007/0108284 A1* | 5/2007 | Pankow et al. | 235/454 |
| 2008/0185432 A1 | 8/2008 | Caballero et al. | |
| 2009/0134221 A1 | 5/2009 | Zhu et al. | |
| 2010/0177076 A1 | 7/2010 | Essinger et al. | |
| 2010/0177080 A1 | 7/2010 | Essinger et al. | |
| 2010/0177707 A1 | 7/2010 | Essinger et al. | |
| 2010/0177749 A1 | 7/2010 | Essinger et al. | |
| 2011/0169999 A1 | 7/2011 | Grunow et al. | |
| 2011/0188214 A1* | 8/2011 | Mishiro | H05K 3/361 361/749 |
| 2011/0202554 A1 | 8/2011 | Powilleit et al. | |
| 2012/0085824 A1* | 4/2012 | Handshaw | G06K 7/10792 235/462.31 |
| 2012/0111946 A1 | 5/2012 | Golant | |
| 2012/0138685 A1 | 6/2012 | Qu et al. | |
| 2012/0168511 A1 | 7/2012 | Kotlarsky et al. | |
| 2012/0168512 A1 | 7/2012 | Kotlarsky et al. | |
| 2012/0193407 A1 | 8/2012 | Barten | |
| 2012/0193423 A1 | 8/2012 | Samek | |
| 2012/0203647 A1 | 8/2012 | Smith | |
| 2012/0223141 A1 | 9/2012 | Good et al. | |
| 2012/0228382 A1 | 9/2012 | Havens et al. | |
| 2012/0248188 A1 | 10/2012 | Kearney | |
| 2012/0327048 A1* | 12/2012 | Ramrattan | H05K 1/148 345/204 |
| 2013/0020392 A1* | 1/2013 | Olmstead | G06K 7/10722 235/440 |
| 2013/0043312 A1 | 2/2013 | Van Horn | |
| 2013/0056285 A1 | 3/2013 | Meagher | |
| 2013/0070322 A1 | 3/2013 | Fritz et al. | |
| 2013/0075168 A1 | 3/2013 | Amundsen et al. | |
| 2013/0082104 A1 | 4/2013 | Kearney et al. | |
| 2013/0175341 A1 | 7/2013 | Kearney et al. | |
| 2013/0175343 A1 | 7/2013 | Good | |
| 2013/0200158 A1 | 8/2013 | Feng et al. | |
| 2013/0214048 A1 | 8/2013 | Wilz | |
| 2013/0256418 A1 | 10/2013 | Havens et al. | |
| 2013/0257744 A1 | 10/2013 | Daghigh et al. | |
| 2013/0257759 A1 | 10/2013 | Daghigh | |
| 2013/0270346 A1 | 10/2013 | Xian et al. | |
| 2013/0278425 A1 | 10/2013 | Cunningham et al. | |
| 2013/0287258 A1 | 10/2013 | Kearney | |
| 2013/0292474 A1 | 11/2013 | Xian et al. | |
| 2013/0292475 A1 | 11/2013 | Kotlarsky et al. | |
| 2013/0292477 A1 | 11/2013 | Hennick et al. | |
| 2013/0293539 A1 | 11/2013 | Hunt et al. | |
| 2013/0293540 A1 | 11/2013 | Laffargue et al. | |
| 2013/0306728 A1 | 11/2013 | Thuries et al. | |
| 2013/0306730 A1 | 11/2013 | Brady et al. | |
| 2013/0306731 A1 | 11/2013 | Pedraro | |
| 2013/0306734 A1 | 11/2013 | Xian et al. | |
| 2013/0307964 A1 | 11/2013 | Bremer et al. | |
| 2013/0308625 A1 | 11/2013 | Corcoran | |
| 2013/0313324 A1 | 11/2013 | Koziol et al. | |
| 2013/0313325 A1 | 11/2013 | Wilz et al. | |
| 2013/0313326 A1 | 11/2013 | Ehrhart | |
| 2013/0327834 A1 | 12/2013 | Hennick et al. | |
| 2013/0341399 A1 | 12/2013 | Xian et al. | |
| 2013/0342717 A1 | 12/2013 | Havens et al. | |
| 2014/0001267 A1 | 1/2014 | Giordano et al. | |
| 2014/0002828 A1 | 1/2014 | Laffargue et al. | |
| 2014/0008430 A1 | 1/2014 | Soule et al. | |
| 2014/0008439 A1 | 1/2014 | Wang | |
| 2014/0021254 A1* | 1/2014 | Marshall | G07F 7/0873 235/435 |
| 2014/0021256 A1 | 1/2014 | Qu et al. | |
| 2014/0025584 A1 | 1/2014 | Liu et al. | |
| 2014/0027518 A1 | 1/2014 | Edmonds et al. | |
| 2014/0034723 A1 | 2/2014 | Van Horn et al. | |
| 2014/0034734 A1 | 2/2014 | Sauerwein | |
| 2014/0036848 A1 | 2/2014 | Pease et al. | |

(56) References Cited

U.S. PATENT DOCUMENTS

| | | | |
|---|---|---|---|
| 2014/0039693 A1 | 2/2014 | Havens et al. | |
| 2014/0042814 A1 | 2/2014 | Kather et al. | |
| 2014/0049120 A1 | 2/2014 | Kohtz et al. | |
| 2014/0049635 A1 | 2/2014 | Laffargue et al. | |
| 2014/0061305 A1 | 3/2014 | Nahill et al. | |
| 2014/0061306 A1 | 3/2014 | Wu et al. | |
| 2014/0061307 A1 | 3/2014 | Wang et al. | |
| 2014/0063289 A1 | 3/2014 | Hussey et al. | |
| 2014/0066136 A1 | 3/2014 | Sauerwein et al. | |
| 2014/0067692 A1 | 3/2014 | Ye et al. | |
| 2014/0070005 A1 | 3/2014 | Nahill et al. | |
| 2014/0071840 A1 | 3/2014 | Venancio | |
| 2014/0074746 A1 | 3/2014 | Wang | |
| 2014/0075846 A1 | 3/2014 | Woodburn | |
| 2014/0076974 A1 | 3/2014 | Havens et al. | |
| 2014/0078341 A1 | 3/2014 | Havens et al. | |
| 2014/0078342 A1 | 3/2014 | Li et al. | |
| 2014/0078345 A1 | 3/2014 | Showering | |
| 2014/0084068 A1 | 3/2014 | Gillet et al. | |
| 2014/0086348 A1 | 3/2014 | Peake et al. | |
| 2014/0097249 A1 | 4/2014 | Gomez et al. | |
| 2014/0098284 A1 | 4/2014 | Oberpriller et al. | |
| 2014/0098792 A1 | 4/2014 | Wang et al. | |
| 2014/0100774 A1 | 4/2014 | Showering | |
| 2014/0100813 A1 | 4/2014 | Showering | |
| 2014/0103115 A1 | 4/2014 | Meier et al. | |
| 2014/0104413 A1 | 4/2014 | McCloskey et al. | |
| 2014/0104414 A1 | 4/2014 | McCloskey et al. | |
| 2014/0104416 A1 | 4/2014 | Giordano et al. | |
| 2014/0104451 A1 | 4/2014 | Todeschini et al. | |
| 2014/0106594 A1 | 4/2014 | Skvoretz | |
| 2014/0106725 A1 | 4/2014 | Sauerwein | |
| 2014/0108010 A1 | 4/2014 | Maltseff et al. | |
| 2014/0108402 A1 | 4/2014 | Gomez et al. | |
| 2014/0108682 A1 | 4/2014 | Caballero | |
| 2014/0110485 A1 | 4/2014 | Toa et al. | |
| 2014/0114530 A1 | 4/2014 | Fitch et al. | |
| 2014/0121445 A1 | 5/2014 | Ding et al. | |
| 2014/0124577 A1 | 5/2014 | Wang et al. | |
| 2014/0124579 A1 | 5/2014 | Ding | |
| 2014/0125842 A1 | 5/2014 | Winegar | |
| 2014/0125853 A1 | 5/2014 | Wang | |
| 2014/0125999 A1 | 5/2014 | Longacre et al. | |
| 2014/0129378 A1 | 5/2014 | Richardson | |
| 2014/0131438 A1 | 5/2014 | Kearney | |
| 2014/0131441 A1 | 5/2014 | Nahill et al. | |
| 2014/0133379 A1 | 5/2014 | Wang et al. | |
| 2014/0140585 A1 | 5/2014 | Wang | |
| 2014/0151453 A1 | 6/2014 | Meier et al. | |
| 2014/0160329 A1 | 6/2014 | Ren et al. | |
| 2014/0192188 A1* | 7/2014 | McEwan et al. | 348/143 |
| 2014/0362286 A1* | 12/2014 | Komi et al. | 348/374 |
| 2015/0193645 A1* | 7/2015 | Colavito | G06K 7/10881 235/472.01 |

OTHER PUBLICATIONS

U.S. Appl. No. 14/264,173 for Autofocus Lens System for Indicia Readers filed Apr. 29, 2014, (Ackley et al.), 39 pages.

U.S. Appl. No. 14/230,322 for Focus Module and Components with Actuator filed Mar. 31, 2014 (Feng et al.); 92 pages.

U.S. Appl. No. 14/222,994 for Method and Apparatus for Reading Optical Indicia Using a Plurality of Data filed Mar. 24, 2014 (Smith et al.); 30 pages.

U.S. Appl. No. 14/231,898 for Hand-Mounted Indicia-Reading Device with Finger Motion Triggering filed Apr. 1, 2014 (Van Horn et al.); 36 pages.

U.S. Appl. No. 29/486,759 for an Imaging Terminal, filed Apr. 2, 2014 (Oberpriller et al.); 8 pages.

U.S. Appl. No. 29/436,337 for an Electronic Device, filed Nov. 5, 2012 (Fitch et al.); 19 pages.

U.S. Appl. No. 29/458,405 for an Electronic Device, filed Jun. 19, 2013 (Fitch et al.); 22 pages.

U.S. Appl. No. 29/459,620 for an Electronic Device Enclosure, filed Jul. 2, 2013 (London et al.); 21 pages.

U.S. Appl. No. 29/459,681 for an Electronic Device Enclosure, filed Jul. 2, 2013 (Chaney et al.); 14 pages.

U.S. Appl. No. 29/459,785 for a Scanner and Charging Base, filed Jul. 3, 2013 (Fitch et al.); 21 pages.

U.S. Appl. No. 29/459,823 for a Scanner, filed Jul. 3, 2013 (Zhou et al.); 13 pages.

U.S. Appl. No. 29/468,118 for an Electronic Device Case, filed Sep. 26, 2013 (Oberpriller et al.); 44 pages.

U.S. Appl. No. 13/367,978, filed Feb. 7, 2012, (Feng et al.); now abandoned.

U.S. Appl. No. 13/736,139 for an Electronic Device Enclosure, filed Jan. 8, 2013 (Chaney); 40 pages.

U.S. Appl. No. 13/771,508 for an Optical Redirection Adapter, filed Feb. 20, 2013 (Anderson); 26 pages.

U.S. Appl. No. 13/780,356 for a Mobile Device Having Object Identification Interface, filed Feb. 28, 2013 (Samek et al.); 21 pages.

U.S. Appl. No. 13/852,097 for a System and Method for Capturing and Preserving Vehicle Event Data, filed Mar. 28, 2013 (Barker et al.); 20 pages.

U.S. Appl. No. 13/902,110 for a System and Method for Display of Information Using a Vehicle-Mount Computer, filed May 24, 2013 (Hollifield); 29 pages.

U.S. Appl. No. 13/902,144, for a System and Method for Display of Information Using a Vehicle-Mount Computer, filed May 24, 2013 (Chamberlin); 23 pages.

U.S. Appl. No. 13/902,242 for a System for Providing a Continuous Communication Link With a Symbol Reading Device, filed May 24, 2013 (Smith et al.); 24 pages.

U.S. Appl. No. 13/912,262 for a Method of Error Correction for 3D Imaging Device, filed Jun. 7, 2013 (Jovanovski et al.); 33 pages.

U.S. Appl. No. 13/912,702 for a System and Method for Reading Code Symbols at Long Range Using Source Power Control, filed Jun. 7, 2013 (Xian et al.); 24 pages.

U.S. Appl. No. 13/922,339 for a System and Method for Reading Code Symbols Using a Variable Field of View, filed Jun. 20, 2013 (Xian et al.); 23 pages.

U.S. Appl. No. 13/927,398 for a Code Symbol Reading System Having Adaptive Autofocus, filed Jun. 26, 2013 (Todeschini); 24 pages.

U.S. Appl. No. 13/930,913 for a Mobile Device Having an Improved User Interface for Reading Code Symbols, filed Jun. 28, 2013 (Gelay et al.); 24 pages.

U.S. Appl. No. 13/933,415 for an Electronic Device Case, filed Jul. 2, 2013 (London et al.); 47 pages.

U.S. Appl. No. 13/947,296 for a System and Method for Selectively Reading Code Symbols, filed Jul. 22, 2013 (Rueblinger et al.); 29 pages.

U.S. Appl. No. 13/950,544 for a Code Symbol Reading System Having Adjustable Object Detection, filed Jul. 25, 2013 (Jiang); 28 pages.

U.S. Appl. No. 13/961,408 for a Method for Manufacturing Laser Scanners, filed Aug. 7, 2013 (Saber et al.); 26 pages.

U.S. Appl. No. 14/018,729 for a Method for Operating a Laser Scanner, filed Sep. 5, 2013 (Feng et al.); 24 pages.

U.S. Appl. No. 14/019,616 for a Device Having Light Source to Reduce Surface Pathogens, filed Sep. 6, 2013 (Todeschini); 23 pages.

U.S. Appl. No. 14/023,762 for a Handheld Indicia Reader Having Locking Endcap, filed Sep. 11, 2013 (Gannon); 31 pages.

U.S. Appl. No. 14/035,474 for Augmented-Reality Signature Capture, filed Sep. 24, 2013 (Todeschini); 33 pages.

U.S. Appl. No. 14/047,896 for Terminal Having Illumination and Exposure Control filed Oct. 7, 2013 (Jovanovski et al.); 32 pages.

U.S. Appl. No. 14/053,175 for Imaging Apparatus Having Imaging Assembly, filed Oct. 14, 2013 (Barber); 39 pages.

U.S. Appl. No. 14/055,234 for Dimensioning System, filed Oct. 16, 2013 (Fletcher); 26 pages.

U.S. Appl. No. 14/053,314 for Indicia Reader, filed Oct. 14, 2013 (Huck); 29 pages.

U.S. Appl. No. 14/065,768 for Hybrid System and Method for Reading Indicia, filed Oct. 29, 2013 (Meier et al.); 22 pages.

(56) References Cited

OTHER PUBLICATIONS

U.S. Appl. No. 14/074,746 for Self-Checkout Shopping System, filed Nov. 8, 2013 (Hejl et al.); 26 pages.

U.S. Appl. No. 14/074,787 for Method and System for Configuring Mobile Devices via NFC Technology, filed Nov. 8, 2013 (Smith et al.); 28 pages.

U.S. Appl. No. 14/087,190 for Optimal Range Indicators for Bar Code Validation, filed Nov. 22, 2013 (Hejl); 27 pages.

U.S. Appl. No. 14/345,735 for Optical Indicia Reading Terminal with Combined Illumination filed Mar. 19, 2014 (Ouyang); 19 pages.

U.S. Appl. No. 14/101,965 for High Dynamic-Range Indicia Reading System, filed Dec. 10, 2013 (Xian); 28 pages.

U.S. Appl. No. 14/118,400 for Indicia Decoding Device with Security Lock, filed Nov. 18, 2013 (Liu); 28 pages.

U.S. Appl. No. 14/150,393 for Incicia-reader Having Unitary Construction Scanner, filed Jan. 8, 2014 (Colavito et al.); 28 pages.

U.S. Appl. No. 14/154,207 for Laser Barcode Scanner, filed Jan. 14, 2014 (Hou et al.); 26 pages.

U.S. Appl. No. 14/154,915 for Laser Scanning Module Employing a Laser Scanning Assembly having Elastomeric Wheel Hinges, filed Jan. 14, 2014 (Havens et al.); 24 pages.

U.S. Appl. No. 14/158,126 for Methods and Apparatus to Change a Feature Set on Data Collection Devices, filed Jan. 17, 2014 (Berthiaume et al.); 53 pages.

U.S. Appl. No. 14/342,551 for Terminal Having Image Data Format Conversion filed Mar. 4, 2014 (Lui et al.); 25 pages.

U.S. Appl. No. 14/342,544 for Imaging Based Barcode Scanner Engine with Multiple Elements Supported on a Common Printed Circuit Board filed Mar. 4, 2014 (Liu et al.); 27 pages.

U.S. Appl. No. 14/257,174 for Reading Apparatus Having Partial Frame Operating Mode filed Apr. 21, 2014, (Barber et al.), 67 pages.

U.S. Appl. No. 14/200,405 for Indicia Reader for Size-Limited Applications filed Mar. 7, 2014 (Feng et al.); 42 pages.

U.S. Appl. No. 14/166,103 for Indicia Reading Terminal Including Optical Filter filed Jan. 28, 2014 (Lu et al.); 29 pages.

\* cited by examiner

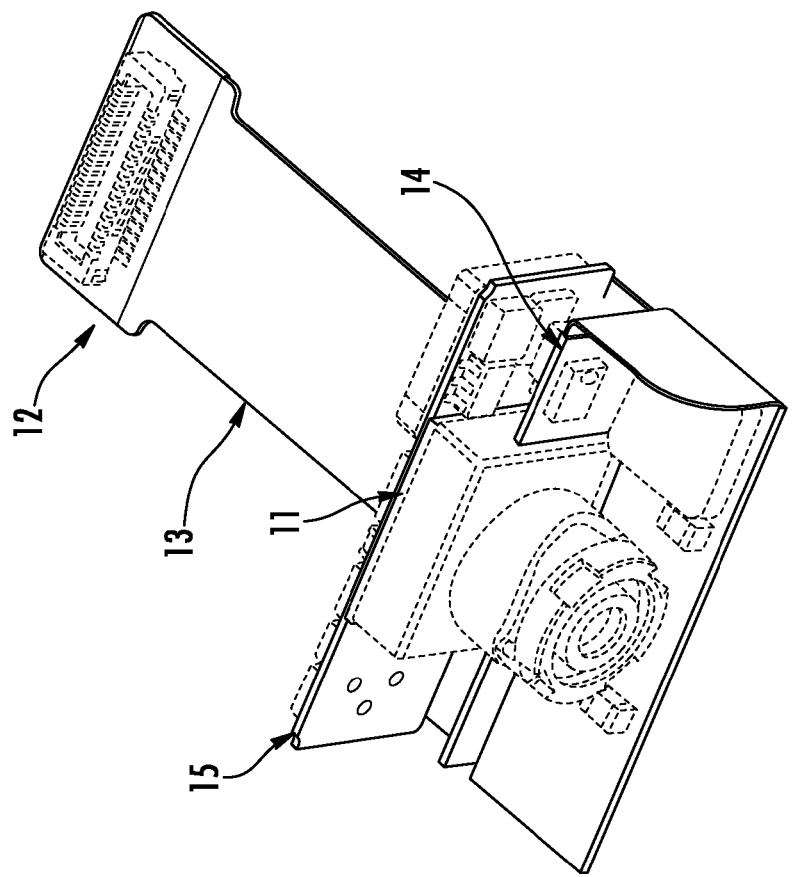
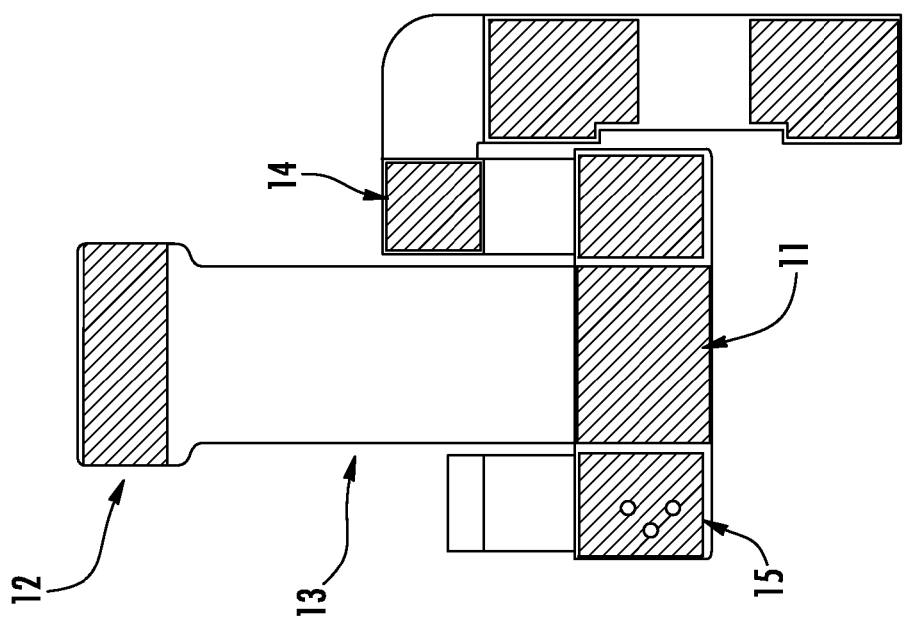

INDICIA-READING MODULE WITH AN INTEGRATED FLEXIBLE CIRCUIT

FIELD OF THE INVENTION

The present invention relates to the field of indicia readers and, more specifically, to a flexible circuit in the indicia-reading module for electrically connecting the module's subassemblies and facilitating integration with a mobile computing device.

BACKGROUND

Generally speaking, indicia readers (e.g., barcode scanners) are electronic devices for recognizing and decoding printed indicia (e.g., barcodes). Imaging indicia readers include a group of lenses (i.e., lens group) for focusing a real image of a target (e.g., barcode) onto an image sensor (e.g., CCD), that converts the real image into a digital signal. In a typical scanning scenario, the image sensor captures a digital image of a barcode, and a processor running algorithms detects and decodes the barcode from the image. The decoded information form this barcode is conveyed to a host device (e.g., mobile computing device).

Most mobile computing devices (e.g., smart-phones) have general-purpose cameras that can be used for indicia reading. As a result, numerous applications towards this purpose have been developed. While these applications perform reasonably well for the casual user, they lack the features, functions, and performance associated with dedicated imaging indicia readers. Illumination, alignment, and image quality may all suffer when using a mobile computing device's general purpose camera for barcode scanning.

Because most users want to carry only one mobile computing device (i.e., MCD), they will be reluctant to trade their mobile device for a dedicated indicia reader. A need, therefore, exists for a dedicated imaging indicia-reading module integrated within a hand-held MCD.

Integration of the indicia-reading module within a host MCD places severe limitations on the module's design. Unique design approaches and construction methods must be combined to allow for such novel integration. For example, reducing size often necessitates splitting a circuit board into a plurality of circuit boards positioned to best fit within a small module housing. Interconnection between these boards is necessary but often bulky due to the connectors required. A need therefore, exists for a board interconnection scheme to allow for the size reduction of an indicia-reading module without sacrificing performance.

SUMMARY

Accordingly, the present invention embraces an indicia-reading module integrated within a mobile computing device (MCD). The indicia-reading module includes a plurality of discrete subassemblies to perform the functions necessary for indicia reading and/or optical character recognition (OCR). The subassemblies are interconnected via a unitary flexible circuit (i.e., flex circuit), physically integrated with and electrical connect to each subassembly. The bendability of the flex circuit allows the subassemblies to be positioned in a module housing at angles with respect to one another. The electrical connection of each subassembly directly to the flex circuit eliminates the need for connectors.

In an exemplary embodiment, the module housing supports and contains five subassemblies: (i) an imaging subassembly for creating a digital image of a target (e.g., barcode), (ii) an aiming subassembly for creating a visible aligning pattern on the target to facilitate the alignment of the target's image (iii) an illuminating subassembly for highlighting a target to brighten the target's image, (iv) an interface subassembly for facilitating communication between the indicia-reading module and a host mobile computing device, and (v) a processing subassembly for recognizing and decoding information within the target's image. Each subassembly is supported and electrically connected by its own discrete, rigid, multilayer printed-circuit-board (PCB). A circuit of conductive traces on a flexible substrate (i.e., flex circuit) electrically connects the subassemblies. This flex circuit is physically integrated between two inner layers of each subassembly's PCB.

In another exemplary embodiment, the module housing supports and contains three subassemblies: (i) an imaging subassembly for creating a digital image of a target (e.g., barcode), (ii) an aiming subassembly for creating a visible aligning pattern on the target to facilitate the alignment of the target's image, and (iii) an illuminating subassembly for highlighting a target to brighten the target's image. Each subassembly is supported and electrically connected by a discrete, rigid, multilayer printed-circuit-board (PCB). A circuit of conductive traces on a flexible substrate (i.e., flex circuit) electrically connects the subassemblies. This flex circuit is physically integrated between two inner layers of each subassembly's PCB. The flex circuit, in this embodiment, is extended out from the module housing and terminated in a discrete, rigid, multilayer PCB. The printed circuit board at the terminus of this extension supports and electrically connects an interface submodule. The interface submodule facilitates communication between the indicia-reading module and a host mobile computing device.

The foregoing illustrative summary, as well as other exemplary objectives and/or advantages of the invention, and the manner in which the same are accomplished, are further explained within the following detailed description and its accompanying drawings.

BRIEF DESCRIPTION OF THE DRAWINGS

FIG. 4a graphically depicts the rigid printed circuit boards and flex circuit of an exemplary embodiment of a non-decoded output indicia-reading module.

FIG. 4b graphically depicts an exemplary non-decoded output indicia-reading module.

DETAILED DESCRIPTION

Figure 1:
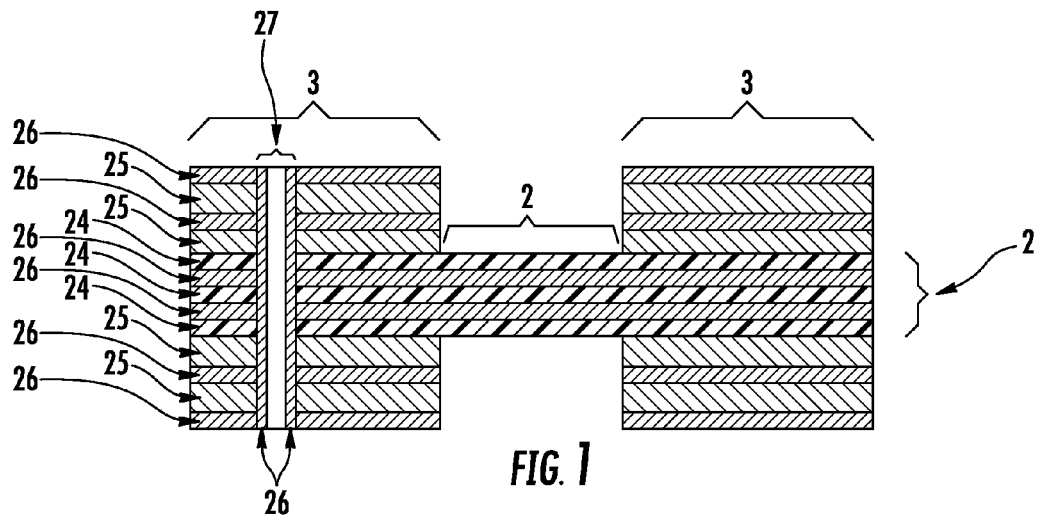
FIG. 1 graphically depicts a cross section of a rigid-flex circuit.

The present invention embraces an indicia-reading module integrated with a host mobile computing device (MCD). The indicia-reading module includes a plurality of interconnected subassemblies to perform the necessary functions for indicia reading and/or optical character recognition (OCR). Each subassembly is supported and electrically connected by a discrete, rigid, multilayer printed-circuit-board (PCB). A flexible circuit, physically integrated between two inner layers of each subassembly's multilayer printed-circuit-board, electrically connects the subassemblies and allows the subassemblies to be positioned in a small module housing that supports and positions most, if not all, of the subassemblies. The indicia-reading module is electrically connected to the host MCD system and physically integrated within the host MCD's body in such a way as to allow for convenient imaging of an indicium (e.g., barcode).

The indicia-reading module's imaging subassembly includes a lens, or group of lenses, for forming a real image of a target (e.g., barcode) on an image sensor. Optical filters may be also be used before the image sensor to eliminate stray light or otherwise improve the image quality. The image sensor is a multi-pixel image sensor (e.g., a CCD or a CMOS sensor) that is capable of rendering a digital image of a target. The digital image may be color or monochrome depending on the application. The size of the image sensor and/or the number of pixels may vary and are typically chosen based on the resolution and field of view requirements. The physical size of the imaging subassembly may be reduced by employing chip or board (COB) technology, to affix and connect an image sensor integrated circuit (IC) to a printed circuit board (PCB). In this way, the customary IC package of the image sensor can be eliminated and the optical loss and subassembly size associated with this IC package can be eliminated.

The indicia-reading module's illuminating subassembly includes an illuminating light source (e.g., LED) and a projection lens. The illuminating light source generates light to highlight a target for imaging in much the same way that a flash illuminates a subject for imaging in traditional photography. The wavelength of the illuminating light source is selected to correspond to the image sensor's sensitivity, which may or may not be in the visible range of the electromagnetic spectrum. The illumination light source may be a broadband light source to cover the entire visible spectrum or a specific narrow-band source, such as red, to optimize a particular image sensor's performance. The light source is of sufficient optical intensity to allow the image sensor to image the target with a short exposure time (e.g., less than a millisecond). The intensity profile of the illuminating light on the target is uniform over the imaging subassembly's field of view. This homogeneity insures that there are no especially bright or dark areas in the digital image. An aperture may also be used between the illuminating light source and the projection lens to limit the extent of the projected light. The electrical components of the illuminating subassembly are supported and connected by a discrete, rigid printed circuit board (PCB) with metallic (e.g., copper) traces etched into a metal cladded board substrate. To keep the PCB small, multiple layers are typically used. Traces on different layers of a multilayer PCB are connected with plated through holes or pins called vias that run through the layers substrate material and connect a trace on one layer to a trace on another.

The indicia-reading module's aiming subassembly includes an aiming light source. The aiming light source may be a light emitting diode (LED) or a laser diode (LD). When an LED is used, the light from the LED illuminates an aperture shaped to display information about the imaging subassembly's field of view. This information may include the edges and/or the center of the field of view. The shape of the aperture, therefore, may be a line, a box, a crosshair, or any other shape to convey this information. A projection lens projects an image of the aperture onto the target. To read an indicia, an operator visually aligns this visual aligning pattern with a target (e.g., a barcode). When aligned, the user is sure that the image of the target will be aligned and centered within the frame of the digital image. This alignment helps the decoding of the indicia. Besides alignment and positioning, this visual aligning pattern can help the user know the proper distance between the module and the indicium. This can be visually interpreted through the focus of the aligning pattern. When the target is at the proper distance from the indicia-reading module, the visual aligning pattern will be in sharp focus. The electrical components for the illuminating subassembly are supported and connected by a discrete, rigid, multilayer PCB.

An aiming subassembly using a laser diode (LD) operates in much the same way as an LED aiming subassembly, however the components used to create the visual aligning pattern are different. When an LD is used as the aiming light source, a diffractive optical element (DOE) may be used to generate the visual aligning pattern and to focus the pattern onto the target. In this way, the DOE may replace both the aperture and the projection lens used in the LED aimer. A collimating lens can be used between the LD and the DOE to expand the laser beam and diffract properly from the DOE. The LD aiming subassembly is capable of generating a very bright aligning pattern and is especially good for long range scanning. The electrical components for the aiming subassembly are supported and connected by a discrete, rigid, multilayer PCB.

Indicia-reading modules may vary in their level of processing. One module embodiment may convey the information of a decoded indicium, while another embodiment may return a digital image suitable for decoding by a host MCD. Indicia-reading modules that decode indicia are known as decoded output indicia-reading modules (i.e., decoded modules). These modules have a processing subassembly with a processor IC for running algorithms to recognize and decode information within the digital image. Indicia-reading modules that do not decode indicia but rather rely on the processing power of the host device for this function are known non-decoded output indicia-reading modules (i.e., non-decoded modules). These modules do not have a processing subassembly. Both modules have an interface subassembly or submodule that communicates with the host MDC, however the requirements for the interface circuitry in each type are different. Non-decoded modules send large amounts of data compared to the decoded modules. As a result, non-decoded modules may have more data lines for carrying high frequency (HF) signals and added components for filtering and conditioning the HF signals. Further, the physical position of the interface PCB may be different for each module. For example, the non-decoded module may have its interface PCB located outside the module housing and close to the connection point on the host device. One reason for this is to insure that any signal filtering or conditioning happens just before reaching the host MCD's interface. Since the decoded output module transmits lower data rate signals at its interface, it may not require this filtering or conditioning and as a result, its interface PCB may be positioned inside the module housing.

The decoded output indicia-reading module (i.e., decoded module) includes a processing subassembly for recognizing and decoding information within the target's image. A processor integrated circuit (IC) in this subassembly runs image processing algorithms to examine a target's digital image and return decoded information. The processor IC may also communicate and control other subassemblies. The electrical components, including the processor IC, for the processing subassembly are supported and connected by a discrete, rigid, multilayer PCB.

The module housing for the non-decoded module is different from the decoded module housing since the non-decoded module has no processing subassembly and since its interface PCB is located at the connection point of the host MCD. The non-decoded module housing supports and positions the imaging, illuminating, and aiming subassemblies, which are affixed to the housing (e.g., snap-fit). The non-decoded module housing size is less than 2 cubic centimeters (e.g., 19.8× 6.8×11 millimeters). The housing may be made from an injection molded plastic and may be thermally conductive or clear (e.g., polycarbonate) based on the requirements of the indicia-reading module.

The module housing for the decoded module contains the imaging, illuminating, aiming, processing, and interface subassemblies. The subassemblies are supported and positioned by the housing in a way to save space. The decoded module housing is less than 2 cubic centimeters (e.g., 18×7×12 millimeters). The housing may be made from injection molded plastic and may be thermally conductive or clear based on other requirements of the indicia-reading module. For example, in some applications the housing may be used as a thermal heat sink while in others optical lenses may be incorporated within the housing to aid in illumination, aiming, or imaging.

The electrical interconnection between printed circuit boards is typically achieved by interconnecting board connectors with a discrete cable that has connectors on each end to mate with the board connectors. This approach takes valuable board space for the board connectors, and the discrete connecting cable may be bulky and prone to unwanted electromagnetic interference (EMI). The board connectors may be lossy, especially for high speed signals and the interconnections may affect reliability. To overcome these problems, a printed circuit technology known as rigid-flex may be employed. Rigid-flex circuits use a flexible substrate circuit (i.e., flex circuit) laminated between two inner layers of a discrete rigid multilayer PCB.

An exemplary rigid-flex circuit, is shown in FIG. 1. In this figure, two discrete, rigid, multilayer PCB's 3 are connected by a common flex circuit 2. The flex circuit 2 is electrically connected to and physically integrated between two inner layers (e.g., the middle two layers) of the rigid multilayer PCB's 3. The flex circuit 2 may, itself, be a multilayered board, such as the two layer flex circuit 2 shown in FIG. 1. The substrate of the flex circuit 2 is a pliable material (e.g., polyimide) 24, while the substrate material of the discrete PCB's is a rigid material (e.g., FR4) 25. The layers are laminated together with adhesive, each layer having a conductive cladding (e.g., copper) 26 for circuitry, shielding, and/or thermal management (e.g., heat sinking). Connections to/from the flex circuit 2 are made using traces and vias 27 (e.g., copper plated through hole).

Figure 2:
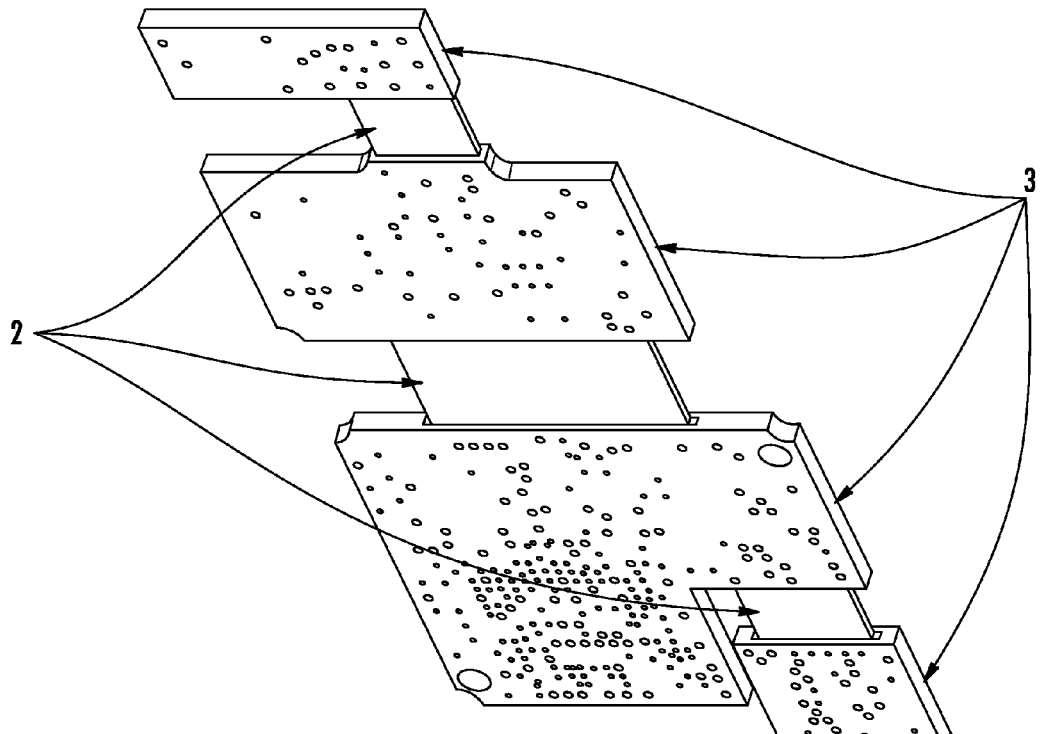
FIG. 2 graphically depicts a rigid-flex circuit with discrete, rigid, multilayer printed circuit boards interconnected by a flex circuit.

Another exemplary rigid-flex circuit is shown in FIG. 2. In this figure, a unitary flex circuit 2 electrically connects four discrete, rigid, multilayer printed circuit boards 3. The flex circuit 2 is laminated between two inner layers of each multilayer PCB 3. The components and traces on the rigid PCB's are electrically connected to the flex circuit through traces and vias. The flex circuit 2 eliminates the board connectors and the discrete interface cable. In addition, the pliability of the flex circuit 2 allows the individual boards 3 to be mounted to the module housing at angles with respect to each other or folded one over the other to reduce the module's overall volume. Also, the flex circuit 2 may facilitate the alignment of a rigid PCB for some function (e.g., illumination). The flex circuit 2 may, itself, be multilayered and may include a layer of solid copper (i.e., plane layer) to provide EMI shielding and/or to conduct and dissipate heat for thermal management.

Figure 3B:
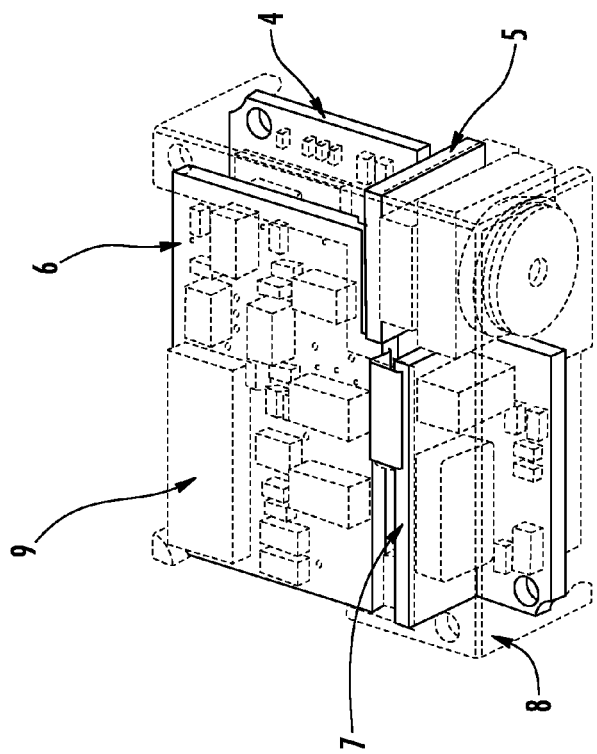
FIG. 3b graphically depicts an exemplary decoded-output indicia-reading module.
Figure 3A:
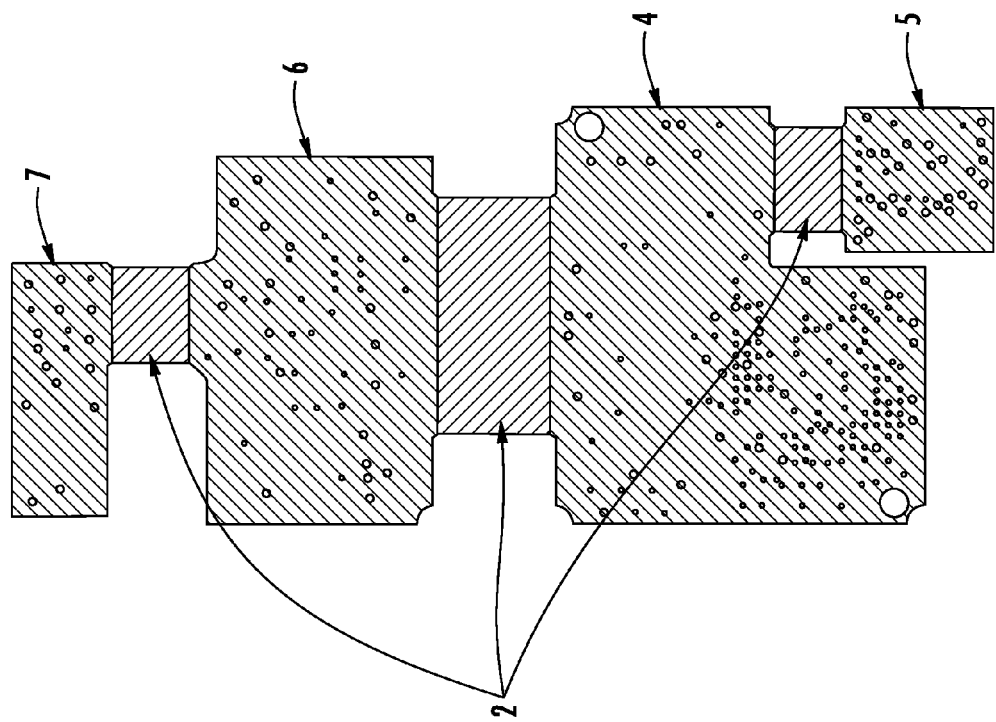
FIG. 3a graphically depicts the rigid printed circuit boards and flex circuit of an exemplary embodiment of a decoded output indicia-reading module.

The rigid printed circuit boards and flex circuit of an exemplary embodiment of an unassembled decoded output indicia-reading module are shown in FIG. 3a. The assembled decoded output indicia-reading module is shown in FIG. 3b. In this embodiment, the processing subassembly's PCB 4 forms the lower most PCB. The imaging subassembly's PCB 5 is positioned so that the image sensor is at 90 degrees relative to the processing subassembly's board and faces the target during scanning. The interface subassembly's board 6 is positioned above the processing subassembly's board 4. The illumination and aiming subassemblies in are mounted onto one PCB 7 and folded so that their projections are towards the target. The four PCB's are held and positioned by the decoded module housing 8. A board connector 9 is located on the interface module to connect to a cable from the host MCD.

The rigid printed circuit boards and flex circuit of an exemplary embodiment of an unassembled non-decoded output indicia-reading module is shown in FIG. 4a, while the assembled decoded output indicia-reading module (without the housing shown for clarity) is depicted in FIG. 4b. In this embodiment, the imaging subassembly's PCB 11 is tilted 90 degrees with respect to the interface submodule's PCB 12 in order to point at the target. The interface submodule is located at the end of an extended section of the flex circuit 13, which forms the interface cable between the indicia-reading module and the host MCD. The interface submodule may contain circuitry and components to (i) perform data conversion (e.g., converting a parallel data interface to MIPI compliant interface and vice versa), (ii) signal level translation (e.g., adjusting the input/output signal level of the indicia-reading module to match the input/output signal level of the host mobile computing device's data bus), and/or (iii) signal conditioning (e.g., filtering for suppression of electromagnetic interference). The interface submodule may also have components and circuitry to facilitate power management, power regulation, decoupling, and impedance matching. The illumination subassembly 14 and the aiming subassembly 15 are on two different PCB's that are positioned and held by the housing on either side of the imaging subassembly 11. A module housing holds the folded assemblies in place. Heat may be used during assembly to help set the folds in the flex circuit.

In summary, the imaging indicia-reading module for barcode reading, document capture, and/or optical character recognition may make use of rigid-flex circuit technology. This approach offers (i) decreased module size for better integration with a host MCD, (ii) reduction of signal loss (e.g., loss associated with high speed signals), and (iii) enhanced electromagnetic compatibility with the host MCD by reducing the unwanted effects of electromagnetic interference (EMI).

* * *

To supplement the present disclosure, this application incorporates entirely by reference the following commonly assigned patents, patent application publications, and patent applications:

U.S. Pat. Nos. 6,832,725; 7,128,266; 7,159,783; 7,413,127; 7,726,575; 8,294,969; 8,317,105; 8,322,622; 8,366,005; 8,371,507; 8,376,233; 8,381,979; 8,390,909; 8,408,464; 8,408,468; 8,408,469; 8,424,768; 8,448,863; 8,457,013; 8,459,557; 8,469,272; 8,474,712; 8,479,992; 8,490,877; 8,517,271; 8,523,076; 8,528,818; 8,544,737; 8,548,242; 8,548,420; 8,550,335; 8,550,354; 8,550,357; 8,556,174; 8,556,176; 8,556,177; 8,559,767; 8,599,957; 8,561,895; 8,561,903; 8,561,905; 8,565,107; 8,571,307; 8,579,200; 8,583,924; 8,584,945; 8,587,595; 8,587,697; 8,588,869; 8,590,789; 8,596,539; 8,596,542; 8,596,543; 8,599,271; 8,599,957; 8,600,158; 8,600,167; 8,602,309; 8,608,053; 8,608,071; 8,611,309; 8,615,487; 8,616,454; 8,621,123;

8,622,303; 8,628,013; 8,628,015; 8,628,016; 8,629,926; 8,630,491; 8,635,309; 8,636,200; 8,636,212; 8,636,215; 8,636,224; 8,638,806; 8,640,958; 8,640,960; 8,643,717; 8,646,692; 8,646,694; 8,657,200; 8,659,397; 8,668,149; 8,678,285; 8,678,286; 8,682,077; 8,687,282;
International Publication No. 2013/163789;
International Publication No. 2013/173985;
International Publication No. 2014/019130;
U.S. Patent Application Publication No. 2008/0185432;
U.S. Patent Application Publication No. 2009/0134221;
U.S. Patent Application Publication No. 2010/0177080;
U.S. Patent Application Publication No. 2010/0177076;
U.S. Patent Application Publication No. 2010/0177707;
U.S. Patent Application Publication No. 2010/0177749;
U.S. Patent Application Publication No. 2011/0169999;
U.S. Patent Application Publication No. 2011/0202554;
U.S. Patent Application Publication No. 2012/0111946;
U.S. Patent Application Publication No. 2012/0138685;
U.S. Patent Application Publication No. 2012/0168511;
U.S. Patent Application Publication No. 2012/0168512;
U.S. Patent Application Publication No. 2012/0193407;
U.S. Patent Application Publication No. 2012/0193423;
U.S. Patent Application Publication No. 2012/0203647;
U.S. Patent Application Publication No. 2012/0223141;
U.S. Patent Application Publication No. 2012/0228382;
U.S. Patent Application Publication No. 2012/0248188;
U.S. Patent Application Publication No. 2013/0043312;
U.S. Patent Application Publication No. 2013/0056285;
U.S. Patent Application Publication No. 2013/0070322;
U.S. Patent Application Publication No. 2013/0075168;
U.S. Patent Application Publication No. 2013/0082104;
U.S. Patent Application Publication No. 2013/0175341;
U.S. Patent Application Publication No. 2013/0175343;
U.S. Patent Application Publication No. 2013/0200158;
U.S. Patent Application Publication No. 2013/0256418;
U.S. Patent Application Publication No. 2013/0257744;
U.S. Patent Application Publication No. 2013/0257759;
U.S. Patent Application Publication No. 2013/0270346;
U.S. Patent Application Publication No. 2013/0278425;
U.S. Patent Application Publication No. 2013/0287258;
U.S. Patent Application Publication No. 2013/0292474;
U.S. Patent Application Publication No. 2013/0292475;
U.S. Patent Application Publication No. 2013/0292477;
U.S. Patent Application Publication No. 2013/0293539;
U.S. Patent Application Publication No. 2013/0293540;
U.S. Patent Application Publication No. 2013/0306728;
U.S. Patent Application Publication No. 2013/0306730;
U.S. Patent Application Publication No. 2013/0306731;
U.S. Patent Application Publication No. 2013/0306734;
U.S. Patent Application Publication No. 2013/0307964;
U.S. Patent Application Publication No. 2013/0313324;
U.S. Patent Application Publication No. 2013/0313325;
U.S. Patent Application Publication No. 2013/0313326;
U.S. Patent Application Publication No. 2013/0327834;
U.S. Patent Application Publication No. 2013/0341399;
U.S. Patent Application Publication No. 2013/0342717;
U.S. Patent Application Publication No. 2014/0001267;
U.S. Patent Application Publication No. 2014/0002828;
U.S. Patent Application Publication No. 2014/0008430;
U.S. Patent Application Publication No. 2014/0008439;
U.S. Patent Application Publication No. 2014/0021256;
U.S. Patent Application Publication No. 2014/0025584;
U.S. Patent Application Publication No. 2014/0027518;
U.S. Patent Application Publication No. 2014/0034723;
U.S. Patent Application Publication No. 2014/0034734;
U.S. Patent Application Publication No. 2014/0036848;
U.S. Patent Application Publication No. 2014/0039693;
U.S. Patent Application Publication No. 2014/0042814;
U.S. Patent Application Publication No. 2014/0049120;
U.S. Patent Application Publication No. 2014/0049635;
U.S. Patent Application Publication No. 2014/0061305;
U.S. Patent Application Publication No. 2014/0061306;
U.S. Patent Application Publication No. 2014/0061307;
U.S. Patent Application Publication No. 2014/0063289;
U.S. Patent Application Publication No. 2014/0066136;
U.S. Patent Application Publication No. 2014/0067692;
U.S. Patent Application Publication No. 2014/0070005;
U.S. Patent Application Publication No. 2014/0071840;
U.S. Patent Application Publication No. 2014/0074746;
U.S. patent application Ser. No. 13/367,978 for a Laser Scanning Module Employing An Elastomeric U-Hinge Based Laser Scanning Assembly, filed Feb. 7, 2012 (Feng et al.);
U.S. patent application Ser. No. 13/400,748 for a Laser Scanning Bar Code Symbol Reading System Having Intelligent Scan Sweep Angle Adjustment Capabilities Over The Working Range Of The System For Optimized Bar Code Symbol Reading Performance, filed Feb. 21, 2012 (Wilz);
U.S. patent application Ser. No. 13/736,139 for an Electronic Device Enclosure, filed Jan. 8, 2013 (Chaney);
U.S. patent application Ser. No. 13/750,304 for Measuring Object Dimensions Using Mobile Computer, filed Jan. 25, 2013;
U.S. patent application Ser. No. 13/771,508 for an Optical Redirection Adapter, filed Feb. 20, 2013 (Anderson);
U.S. patent application Ser. No. 13/780,158 for a Distraction Avoidance System, filed Feb. 28, 2013 (Sauerwein);
U.S. patent application Ser. No. 13/780,196 for Android Bound Service Camera Initialization, filed Feb. 28, 2013 (Todeschini et al.);
U.S. patent application Ser. No. 13/780,271 for a Vehicle Computer System with Transparent Display, filed Feb. 28, 2013 (Fitch et al.);
U.S. patent application Ser. No. 13/780,356 for a Mobile Device Having Object-Identification Interface, filed Feb. 28, 2013 (Samek et al.);
U.S. patent application Ser. No. 13/784,933 for an Integrated Dimensioning and Weighing System, filed Mar. 5, 2013 (McCloskey et al.);
U.S. patent application Ser. No. 13/785,177 for a Dimensioning System, filed Mar. 5, 2013 (McCloskey et al.);
U.S. patent application Ser. No. 13/792,322 for a Replaceable Connector, filed Mar. 11, 2013 (Skvoretz);
U.S. patent application Ser. No. 13/852,097 for a System and Method for Capturing and Preserving Vehicle Event Data, filed Mar. 28, 2013 (Barker et al.);
U.S. patent application Ser. No. 13/895,846 for a Method of Programming a Symbol Reading System, filed Apr. 10, 2013 (Corcoran);
U.S. patent application Ser. No. 13/902,110 for a System and Method for Display of Information Using a Vehicle-Mount Computer, filed May 24, 2013 (Hollifield);
U.S. patent application Ser. No. 13/902,144, for a System and Method for Display of Information Using a Vehicle-Mount Computer, filed May 24, 2013 (Chamberlin);
U.S. patent application Ser. No. 13/902,242 for a System For Providing A Continuous Communication Link With A Symbol Reading Device, filed May 24, 2013 (Smith et al.);
U.S. patent application Ser. No. 13/912,262 for a Method of Error Correction for 3D Imaging Device, filed Jun. 7, 2013 (Jovanovski et al.);
U.S. patent application Ser. No. 13/912,702 for a System and Method for Reading Code Symbols at Long Range Using Source Power Control, filed Jun. 7, 2013 (Xian et al.);

U.S. patent application Ser. No. 13/922,339 for a System and Method for Reading Code Symbols Using a Variable Field of View, filed Jun. 20, 2013 (Xian et al.);

U.S. patent application Ser. No. 13/927,398 for a Code Symbol Reading System Having Adaptive Autofocus, filed Jun. 26, 2013 (Todeschini);

U.S. patent application Ser. No. 13/930,913 for a Mobile Device Having an Improved User Interface for Reading Code Symbols, filed Jun. 28, 2013 (Gelay et al.);

U.S. patent application Ser. No. 13/933,415 for an Electronic Device Case, filed Jul. 2, 2013 (London et al.);

U.S. patent application Ser. No. 13/947,296 for a System and Method for Selectively Reading Code Symbols, filed Jul. 22, 2013 (Rueblinger et al.);

U.S. patent application Ser. No. 13/950,544 for a Code Symbol Reading System Having Adjustable Object Detection, filed Jul. 25, 2013 (Jiang);

U.S. patent application Ser. No. 13/961,408 for a Method for Manufacturing Laser Scanners, filed Aug. 7, 2013 (Saber et al.);

U.S. patent application Ser. No. 13/974,374 for Authenticating Parcel Consignees with Indicia Decoding Devices, filed Aug. 23, 2013 (Ye et al.);

U.S. patent application Ser. No. 14/018,729 for a Method for Operating a Laser Scanner, filed Sep. 5, 2013 (Feng et al.);

U.S. patent application Ser. No. 14/019,616 for a Device Having Light Source to Reduce Surface Pathogens, filed Sep. 6, 2013 (Todeschini);

U.S. patent application Ser. No. 14/023,762 for a Handheld Indicia Reader Having Locking Endcap, filed Sep. 11, 2013 (Gannon);

U.S. patent application Ser. No. 14/035,474 for Augmented-Reality Signature Capture, filed Sep. 24, 2013 (Todeschini);

U.S. patent application Ser. No. 14/047,896 for Terminal Having Illumination and Exposure Control filed Oct. 7, 2013 (Jovanovski et al.);

U.S. patent application Ser. No. 14/035,474 for Augmented-Reality Signature Capture, filed Sep. 24, 2013 (Todeschini);

U.S. patent application Ser. No. 14/050,515 for Hybrid-Type Bioptical, filed Oct. 10, 2013 (Edmonds et al.);

U.S. patent application Ser. No. 14/053,175 for Imaging Apparatus Having Imaging Assembly, filed Oct. 14, 2013 (Barber);

U.S. patent application Ser. No. 14/055,234 for Dimensioning System, filed Oct. 16, 2013 (Fletcher);

U.S. patent application Ser. No. 14/055,353 for Dimensioning System, filed Oct. 16, 2013 (Giordano et al.);

U.S. patent application Ser. No. 14/055,383 for Dimensioning System, filed Oct. 16, 2013 (Li et al.);

U.S. patent application Ser. No. 14/053,314 for Indicia Reader, filed Oct. 14, 2013 (Huck);

U.S. patent application Ser. No. 14/058,762 for Terminal Including Imaging Assembly, filed Oct. 21, 2013 (Gomez et al.);

U.S. patent application Ser. No. 14/062,239 for Chip on Board Based Highly Integrated Imager, filed Oct. 24, 2013 (Toa et al.);

U.S. patent application Ser. No. 14/065,768 for Hybrid System and Method for Reading Indicia, filed Oct. 29, 2013 (Meier et al.);

U.S. patent application Ser. No. 14/074,746 for Self-Checkout Shopping System, filed Nov. 8, 2013 (Hejl et al.);

U.S. patent application Ser. No. 14/074,787 for Method and System for Configuring Mobile Devices via NFC Technology, filed Nov. 8, 2013 (Smith et al.);

U.S. patent application Ser. No. 14/082,468 for Encoded Information Reading Terminal with Wireless Path Selection Capability, filed Nov. 18, 2013 (Wang et al.);

U.S. patent application Ser. No. 14/087,190 for Optimal Range Indicators for Bar Code Validation, filed Nov. 22, 2013 (Hejl);

U.S. patent application Ser. No. 14/093,484 for System for Capturing a Document in an Image Signal, filed Dec. 1, 2013 (Showering);

U.S. patent application Ser. No. 14/093,487 for Method and System Operative to Process Color Image Data, filed Dec. 1, 2013 (Li et al.);

U.S. patent application Ser. No. 14/093,490 for Imaging Terminal Having Image Sensor and Lens Assembly, filed Dec. 1, 2013 (Havens et al.);

U.S. patent application Ser. No. 14/093,624 for Apparatus Operative for Capture of Image Data, filed Dec. 2, 2013 (Havens et al.);

U.S. patent application Ser. No. 14/094,087 for Method and System for Communicating Information in an Digital Signal, filed Dec. 2, 2013 (Peake et al.);

U.S. patent application Ser. No. 14/101,965 for High Dynamic-Range Indicia Reading System, filed Dec. 10, 2013 (Xian);

U.S. patent application Ser. No. 14/107,048 for Roaming Encoded Information Reading Terminal, filed Dec. 16, 2013 (Wang et al.);

U.S. patent application Ser. No. 14/118,400 for Indicia Decoding Device with Security Lock, filed Nov. 18, 2013 (Liu);

U.S. patent application Ser. No. 14/138,206 for System and Method to Store and Retrieve Indentifier Associated Information, filed Dec. 23, 2013 (Gomez et al.);

U.S. patent application Ser. No. 14/143,399 for Device Management Using Virtual Interfaces, filed Dec. 30, 2013 (Caballero);

U.S. patent application Ser. No. 14/147,992 for Decoding Utilizing Image Data, filed Jan. 6, 2014 (Meier et al.);

U.S. patent application Ser. No. 14/150,393 for Incicia-reader Having Unitary Construction Scanner, filed Jan. 8, 2014 (Colavito et al.);

U.S. patent application Ser. No. 14/153,111 for Indicia Reading Terminal Including Frame Quality Evaluation Processing, filed Jan. 13, 2014 (Wang et al.);

U.S. patent application Ser. No. 14/153,142 for Imaging Apparatus Comprising Image Sensor Array having Shared Global Shutter Circuitry, filed Jan. 13, 2014 (Wang);

U.S. patent application Ser. No. 14/153,182 for System and Method to Manipulate an Image, filed Jan. 13, 2014 (Longacre et al.);

U.S. patent application Ser. No. 14/153,213 for Apparatus Comprising Image Sensor Array and Illumination Control, filed Jan. 13, 2014 (Ding);

U.S. patent application Ser. No. 14/153,249 for Terminal Operative for Storing Frame of Image Data, filed Jan. 13, 2014 (Winegar);

U.S. patent application Ser. No. 14/154,207 for Laser Barcode Scanner, filed Jan. 14, 2014 (Hou et al.);

U.S. patent application Ser. No. 14/154,915 for Laser Scanning Module Employing a Laser Scanning Assembly having Elastomeric Wheel Hinges, filed Jan. 14, 2014 (Havens et al.);

U.S. patent application Ser. No. 14/158,126 for Methods and Apparatus to Change a Feature Set on Data Collection Devices, filed Jan. 17, 2014 (Berthiaume et al.);

U.S. patent application Ser. No. 14/159,074 for Wireless Mesh Point Portable Data Terminal, filed Jan. 20, 2014 (Wang et al.);

U.S. patent application Ser. No. 14/159,509 for MMS Text Messaging for Hand Held Indicia Reader, filed Jan. 21, 2014 (Kearney);

U.S. patent application Ser. No. 14/159,603 for Decodable Indicia Reading Terminal with Optical Filter, filed Jan. 21, 2014 (Ding et al.);

U.S. patent application Ser. No. 14/160,645 for Decodable Indicia Reading Terminal with Indicia Analysis Functionality, filed Jan. 22, 2014 (Nahill et al.);

U.S. patent application Ser. No. 14/161,875 for System and Method to Automatically Discriminate Between Different Data Types, filed Jan. 23, 2014 (Wang);

U.S. patent application Ser. No. 14/165,980 for System and Method for Measuring Irregular Objects with a Single Camera filed Jan. 28, 2014 (Li et al.);

U.S. patent application Ser. No. 14/166,103 for Indicia Reading Terminal Including Optical Filter filed Jan. 28, 2014 (Lu et al.);

U.S. patent application Ser. No. 14/176,417 for Devices and Methods Employing Dual Target Auto Exposure filed Feb. 10, 2014 (Meier et al.);

U.S. patent application Ser. No. 14/187,485 for Indicia Reading Terminal with Color Frame Processing filed Feb. 24, 2014 (Ren et al.);

U.S. patent application Ser. No. 14/200,405 for Indicia Reader for Size-Limited Applications filed Mar. 7, 2014 (Feng et al.);

U.S. patent application Ser. No. 14/342,544 for Imaging Based Barcode Scanner Engine with Multiple Elements Supported on a Common Printed Circuit Board filed Mar. 4, 2014 (Liu et al.);

U.S. patent application Ser. No. 14/342,551 for Terminal Having Image Data Format Conversion filed Mar. 4, 2014 (Lui et al.); and U.S. patent application Ser. No. 14/345,735 for Optical Indicia Reading Terminal with Combined Illumination filed Mar. 19, 2014 (Ouyang).

\* \* \*

In the specification and/or figures, typical embodiments of the invention have been disclosed. The present invention is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. An indicia-reading module integrated within a host mobile computing device (MCD), comprising:
   a plurality of subassemblies, each subassembly supported and connected by a discrete, rigid, multilayer printed-circuit-board (PCB);
   a module housing configured to support and contain the subassemblies;
   a flex-circuit including conductive traces on a flexible substrate, wherein the flex-circuit is electrically connected to and physically integrated between two inner layers of each subassembly's multilayer printed-circuit-board to (i) electrically interconnect the subassemblies, (ii) facilitate positioning of each subassembly within the module housing, (iii) provide electromagnetic interference (EMI) shielding, and (iv) conduct and dissipate heat; and
   an interface to facilitate communication with the host mobile computing device, the interface comprising circuitry and components that are supported and electrically connected by a discrete, rigid, multilayer printed-circuit-board (PCB), wherein (i) the interface is positioned outside of the module housing and (ii) the flex-circuit is electrically connected to and physically integrated between two inner layers of the interface's discrete, rigid, multilayer PCB.

2. The indicia-reading module according to claim 1, wherein the module housing has a volume of less than 2 cubic centimeters.

3. The indicia-reading module according to claim 1, wherein the plurality of subassemblies comprises:
   (i) an imaging subassembly configured to capture a digital image of a target;
   (ii) an aiming subassembly configured to project a visible aligning pattern on the target to facilitate the alignment of the target's image; and
   (iii) an illuminating subassembly configured to project light onto the target to brighten the target's image.

4. The indicia-reading module according to claim 1, wherein the interface includes a converter integrated circuit (IC) configured to convert a parallel data signal into a MIPI compliant signal.

5. The indicia-reading module according to claim 1, wherein the interface includes a level-shifter integrated circuit (IC) configured to adjust the input/output (I/O) signal level of the indicia-reading module to match the I/O signal level of the host mobile computing device.

6. The indicia-reading module according to claim 1, wherein the interface includes an electromagnetic interference (EMI) filter configured to suppress electromagnetic interference.

7. The indicia-reading module according to claim 1, wherein the plurality of subassemblies comprises (i) an imaging subassembly configured to capture a digital image of a target, (ii) an aiming subassembly configured to project a visible aligning pattern on the target to facilitate the alignment of the target's image, (iii) an illuminating subassembly configured to project light onto a target to brighten the target's image, and (iv) a processing subassembly configured to decode indicia information within the target's image.

8. The indicia-reading module according to claim 1, wherein the interface includes an output connector to facilitate connection with a host mobile computing device via a discrete cable, the output connector being mounted to the interface' discrete, rigid, multi-layer printed-circuit-board.

9. An indicia-reading module integrated within a host mobile computing device (MCD), comprising:
   an imaging subassembly configured to capture a digital image of a target, the imaging subassembly supported and connected by a first rigid, multilayer printed-circuit-board (PCB) and positioned within a module housing;
   an aiming subassembly configured to project a visible aligning pattern on the target to facilitate the alignment of the target's image, the aiming subassembly supported and connected by a second rigid, multilayer printed-circuit-board (PCB) and positioned within the module housing;
   an illuminating subassembly configured to project light onto a target to brighten the target's image, the illuminating subassembly supported and connected by a third rigid, multilayer printed-circuit-board (PCB) and positioned within the module housing;

an interface comprising circuitry and components configured to provide communication between the indicia-reading module and the host mobile computing device, the interface connected by a fourth rigid, multilayer printed-circuit-board (PCB) and positioned outside the module housing; and a flex-circuit including conductive traces on a flexible substrate, wherein (i) the flex-circuit is electrically connected to and physically integrated between two inner layers of the imaging subassembly, the aiming subassembly, the illuminating subassembly, and the interface, respectively, and (ii) the flex-circuit is folded to facilitate the positioning of the imaging subassembly, the aiming subassembly, and the illuminating subassembly within the module housing.

10. The indicia-reading module according to claim 9, wherein imaging subassembly, the aiming subassembly, the illuminating subassembly, and the interface are spaced apart from one another.

11. The indicia-reading module according to claim 9, wherein the module housing has a volume of less than 2 cubic centimeters.

12. The indicia-reading module according to claim 9, wherein the interface includes a converter integrated circuit (IC) configured to convert a parallel data signal into a MIPI compliant signal.

13. The indicia-reading module according to claim 9, wherein the interface includes a level-shifter integrated circuit (IC) configured to adjust the input/output (I/O) signal level of the indicia-reading module to match the I/O signal level of the host mobile computing device.

14. The indicia-reading module according to claim 9, wherein the interface includes an electromagnetic interference (EMI) filter configured to suppress electromagnetic interference.

15. The indicia-reading module according to claim 9, wherein the the imaging subassembly, the aiming subassembly, and the illuminating subassembly are positioned within and secured to the module housing using snap fittings.

* * * * *